(12) United States Patent
Balakrishnan et al.

(10) Patent No.: US 9,536,939 B1
(45) Date of Patent: Jan. 3, 2017

(54) HIGH DENSITY VERTICALLY INTEGRATED FEOL MIM CAPACITOR

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/925,433

(22) Filed: Oct. 28, 2015

(51) Int. Cl.
*H01L 49/02* (2006.01)
*H01L 29/92* (2006.01)

(52) U.S. Cl.
CPC ..................... *H01L 28/60* (2013.01)

(58) Field of Classification Search
CPC ................. H01L 28/60; H01L 29/92
USPC .......................................... 438/393
See application file for complete search history.

(56) References Cited

U.S. PATENT DOCUMENTS

| | | | | |
|---|---|---|---|---|
| 8,343,845 B2 * | 1/2013 | Kim | ............... | H01G 4/01 257/296 |
| 8,420,476 B2 | 4/2013 | Booth, Jr. et al. | | |
| 8,841,185 B2 | 9/2014 | Khakifirooz et al. | | |
| 2003/0193058 A1 | 10/2003 | Fried et al. | | |
| 2007/0170521 A1* | 7/2007 | Abadeer | ............... | H01L 21/845 257/401 |
| 2010/0240179 A1* | 9/2010 | Kim | ............... | H01G 4/01 438/239 |
| 2011/0291166 A1* | 12/2011 | Booth, Jr. | ............... | H01L 21/823821 257/296 |
| 2011/0298025 A1 | 12/2011 | Haensch et al. | | |
| 2012/0098132 A1* | 4/2012 | Park | ............... | H01L 28/75 257/745 |
| 2013/0193500 A1 | 8/2013 | Chen | | |
| 2013/0221483 A1* | 8/2013 | Popp | ............... | H01L 28/90 257/532 |
| 2015/0318296 A1* | 11/2015 | Kim | ............... | H01L 27/11573 257/296 |
| 2016/0043163 A1* | 2/2016 | Seo | ............... | H01L 27/10814 438/396 |

\* cited by examiner

*Primary Examiner* — Moazzam Hossain
(74) *Attorney, Agent, or Firm* — Scully, Scott, Murphy & Presser, P.C.; Louis J. Percello, Esq.

(57) ABSTRACT

A metal-insulator-metal (MIM) capacitor is provided on a surface of an insulator layer that is located on a handle substrate. The MIM capacitor includes a first metal structure extending upwards from a first portion of the insulator layer, a second metal structure extending upwards from a second portion of the insulator layer, and an oxide fin located between the first and second metal structures, wherein the oxide fin directly contacts an entirety of a sidewall surface of the first metal structure and an entirety of a sidewall surface of the second metal structure, the oxide fin having a topmost surface that is coplanar with a topmost surface of both the first and second metal structures.

10 Claims, 5 Drawing Sheets

US 9,536,939 B1

HIGH DENSITY VERTICALLY INTEGRATED FEOL MIM CAPACITOR

BACKGROUND

The present application relates to semiconductor technology, and more particularly to a semiconductor structure including a vertically integrated front-end-of-the-line (FEOL) metal-insulator-metal (MIM) capacitor that has a high capacitance density. The present application also relates to a method of forming such a semiconductor structure.

A capacitor is a passive two-terminal electrical component used to store electrical energy temporarily in an electrical field. The forms of conventional capacitors vary widely, but each capacitor contains at least two electrical conductors (i.e., plates) separated by a dielectric (i.e., an insulator) that can store energy by becoming polarized. Capacitors are widely used as parts of electrical circuits in many common electrical devices. Unlike a resistor, an ideal capacitor does not dissipate energy. Instead, a capacitor stores energy in the form of an electrostatic field between its plates.

Metal-insulator-metal (MIM) capacitors represent one class of capacitors in which an insulator layer is sandwiched between a first conductive metal (i.e., first plate) and a second conductive metal (i.e., second plate). Conventional MIM capacitors are typically planar devices meaning that the first conductive metal is formed on a surface of a substrate, followed by the formation of the insulator layer on an exposed surface of the first conductive metal, and followed by the formation of the second conductive metal on an exposed surface of the insulator layer. Stated in other terms, the various components of a planar MIM are vertically stacked one atop another.

Moreover, MIM capacitors are typically formed in the back-end-of-the-line (BEOL). BEOL represents a second portion of an integrated circuit (IC) fabrication where the individual devices such as, for example, transistors, get interconnected with wiring on the wafer. The front-end-of-the-line (i.e., FEOL) is the first portion of IC fabrication where the individual devices such as, for example, transistors, are formed within and/or upon a semiconductor substrate.

In such capacitors, density is important in order to minimize the area occupied by the capacitors. Moreover, high quality dielectric-to-metal interfaces are needed in order to minimize capacitance variability.

In view of the above, there is need for providing a high density MIM capacitor that can be integrated into the FEOL rather than the BEOL, in which the dielectric-to-metal interfaces of such FEOL capacitors are of high quality.

SUMMARY

In one aspect of the present application, a semiconductor structure is provided. In one embodiment of the present application, the semiconductor structure includes a metal-insulator-metal (MIM) capacitor located on a surface of an insulator layer that is located on a handle substrate. The MIM capacitor includes a first metal structure extending upwards from a first portion of the insulator layer, a second metal structure extending upwards from a second portion of the insulator layer, and an oxide fin located between the first and second metal structures, wherein the oxide fin directly contacts an entirety of a sidewall surface of the first metal structure and an entirety of a sidewall surface of the second metal structure, the oxide fin having a topmost surface that is coplanar with a topmost surface of both the first and second metal structures. The MIM capacitor of the present application is located in the FEOL. As such, the MIM capacitor of the present application is not located within or upon an interconnect dielectric material that includes any interconnect wiring.

In another aspect of the present application, a method of forming a semiconductor structure, i.e., MIM capacitor, in the FEOL is provided. In accordance with an embodiment of the present application, the method of the present application includes forming an oxide material surrounding a plurality of silicon germanium alloy portions having a first germanium content, each of the silicon germanium alloy portions extending upwards from a surface of an insulator layer. Next, a thermal condensation process is performed to convert each silicon germanium alloy portion into a silicon germanium alloy fin having a second germanium content that is greater than the first germanium content. A planarization process is then performed to expose a topmost surface of each silicon germanium alloy fin and to form oxide fins located on each sidewall surface of each silicon germanium alloy fin, wherein at least one of the oxide fins directly contacts a sidewall surface of one of the silicon germanium alloy fins and a sidewall surface of another of the silicon germanium alloy fins. Next, each silicon germanium alloy fin is replaced with a metal structure to provide a vertically orientated metal-insulator-metal (MIM) capacitor structure.

DETAILED DESCRIPTION

Figure 1:
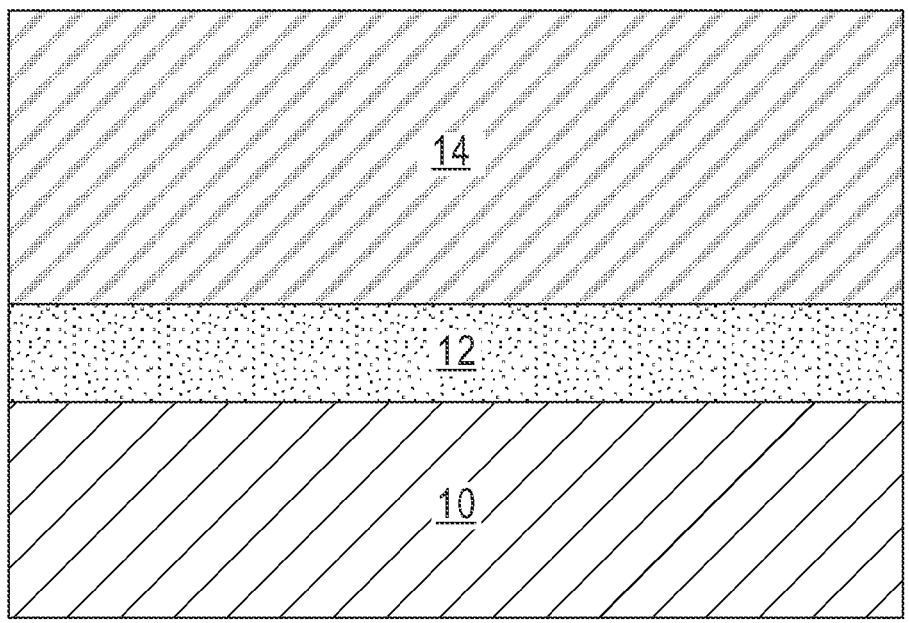
FIG. 1 is a cross sectional view of an exemplary semiconductor structure including, from bottom to top, a handle substrate, an insulator layer, and a silicon germanium alloy layer having a first germanium content that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including, from bottom to top, a handle substrate 10, an insulator layer 12, and a silicon germanium alloy layer 14 having a first germanium content that can be employed in one embodiment of the present application. Collectively, the handle substrate 10, the insulator layer 12 and the silicon germanium alloy layer 14 may be referred to herein as a silicon germanium-on-insulator (SGOI) substrate.

In one embodiment of the present application, the handle substrate 10 includes a semiconductor material. The term "semiconductor" as used herein in connection with the term semiconductor material denotes any material having semiconductor properties and including, for example, Si, Ge, SiGe, SiC, SiGeC, III-V compound semiconductors containing at least one element from Group III of the Periodic Table of Elements and at least one element from Group V of the Periodic Table of Elements, or II-VI compound semiconductors containing at least one element from Group II of the Periodic Table of Elements and at least one element from Group VI of the Periodic Table of Elements. Multilayers of these semiconductor materials can also be used as the semiconductor material of the handle substrate 10. In some embodiments, the handle substrate 10 may include a silicon germanium alloy having a germanium content that is the same as, or different from, the first germanium content of the silicon germanium alloy layer 14.

In another embodiment, the handle substrate 10 may be composed of an insulator material and/or a conductive material. In yet another embodiment, the handle substrate 10 is omitted. When present, the handle substrate 10 provides mechanical support for the insulator layer 12 and the silicon germanium alloy layer 14.

In some embodiments of the present application, the handle substrate 10 and the silicon germanium alloy layer 14 may have a same crystal orientation. In other embodiments, the handle substrate 10 and the silicon germanium alloy layer 14 may have a different crystal orientation. The crystal orientation of the handle substrate 10 and the silicon germanium alloy layer 14 may be {100}, {110}, or {111}. Other crystallographic orientations besides those specifically mentioned can also be used in the present application. The handle substrate 10 and the silicon germanium alloy layer 14 may be a single crystalline semiconductor material, a polycrystalline material, or an amorphous material. Typically, at least the silicon germanium alloy layer 14 is a single crystalline semiconductor material.

The insulator layer 12 may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet another embodiment, insulator layer 12 includes, in any order, an oxide and a nitride. For example, a silicon dioxide/silicon nitride or silicon dioxide/boron nitride stack may be used as the insulator layer 12.

In one embodiment of the present application, the first germanium content of the silicon germanium alloy layer 14 is from 15 atomic percent to 35 atomic percent. Other germanium contents that are lesser than, or greater than, the aforementioned range can also be used as the first germanium content of the silicon germanium alloy layer 14.

The SGOI substrate shown in FIG. 1 may be formed utilizing standard processes including for example, a layer transfer process. When a layer transfer process is employed, two semiconductor wafers (at least one of which includes an insulator layer and at least one that comprises a silicon germanium alloy having the first germanium content) are typically bonded together. In another embodiment, the SGOI substrate shown in FIG. 1 can be formed by first providing a silicon-on-insulator (SOI) substrate including a topmost layer of silicon. A silicon germanium alloy can then be epitaxially grown atop the topmost layer of silicon and a thermal mixing process can be used to provide the SGOI substrate shown in FIG. 1.

In one embodiment of the present application, the silicon germanium alloy layer 14 can have a thickness from 10 nm to 100 nm. Other thicknesses that are greater than, or lesser than, the aforementioned thickness range can also be used as the thickness of the silicon germanium alloy layer 14. In some embodiments, a thinning step such as, for example, planarization or etching can be used to reduce the thickness of silicon germanium alloy layer 14 to a value within a desired thickness range. The insulator layer 12 typically has a thickness from 1 nm to 200 nm. Other thicknesses that are greater than, or lesser than, the aforementioned thickness ranges can also be used as the thickness of insulator layer 12. The thickness of the handle substrate 10 is inconsequential to the present application.

Figure 2:
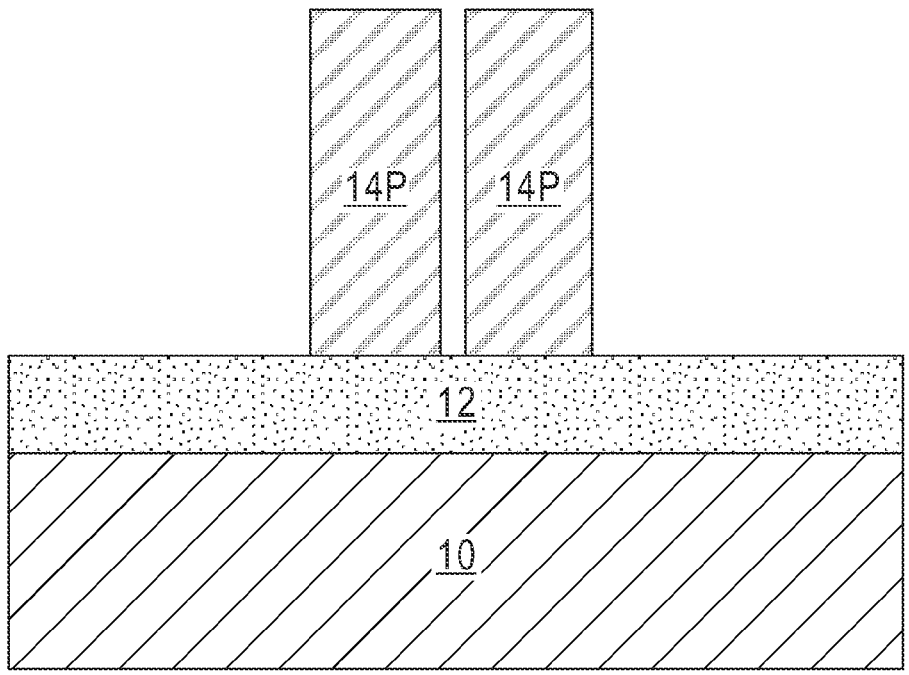
FIG. 2 is a cross sectional view of the exemplary semiconductor structure of FIG. 1 after patterning the silicon germanium alloy layer to provide a plurality of silicon germanium alloy portions having the first germanium content extending upwards from a surface of the insulator layer.

Referring now to FIG. 2, there is illustrated the exemplary semiconductor structure of FIG. 1 after patterning the silicon germanium alloy layer 14 to provide a plurality of silicon germanium alloy portions 14P having the first germanium content extending upwards from a surface of the insulator layer 12. In one embodiment, and as illustrated, a pair of silicon germanium alloy portions 14P is formed on the insulator layer 12.

In one embodiment, the patterning process used to define each silicon germanium alloy portion 14P may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers (i.e., silicon germanium alloy layer 14) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. The etch stops on a topmost surface of the insulator layer 12.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Each silicon germanium alloy portion 14P includes a remaining portion of the silicon germanium alloy layer 14, and includes a pair of vertical sidewalls that are parallel to each other. As used herein, a surface is "vertical" if there exists a vertical plane from which the surface does not deviate by more than three times the root mean square roughness of the surface. In one embodiment of the present application, each silicon germanium alloy portion 14P may have a width from 15 nm to 200 nm; the height of each silicon germanium alloy portion 14P is determined by the thickness of the silicon germanium alloy layer 14. The height and width of each silicon germanium alloy portion 14P can be referred to as a first height and first width, respectively. Other widths that are lesser than, or greater than the range mentioned herein can also be used in the present application so long as the silicon germanium alloy portions are wide enough to allow for the subsequent formation of silicon germanium alloy fins utilizing a thermal condensation process. Each silicon germanium alloy portion 14P can be separated by a pitch of from 20 nm to 100 nm. Also, each silicon germanium alloy portion 14P is oriented parallel to each other. As is shown, each silicon germanium alloy portion 14P has a topmost surface that is coplanar with each other. Also, each silicon germanium alloy portion 14P has a bottommost surface that directly contacts a portion of the underlying insulator layer 12.

Figure 3:
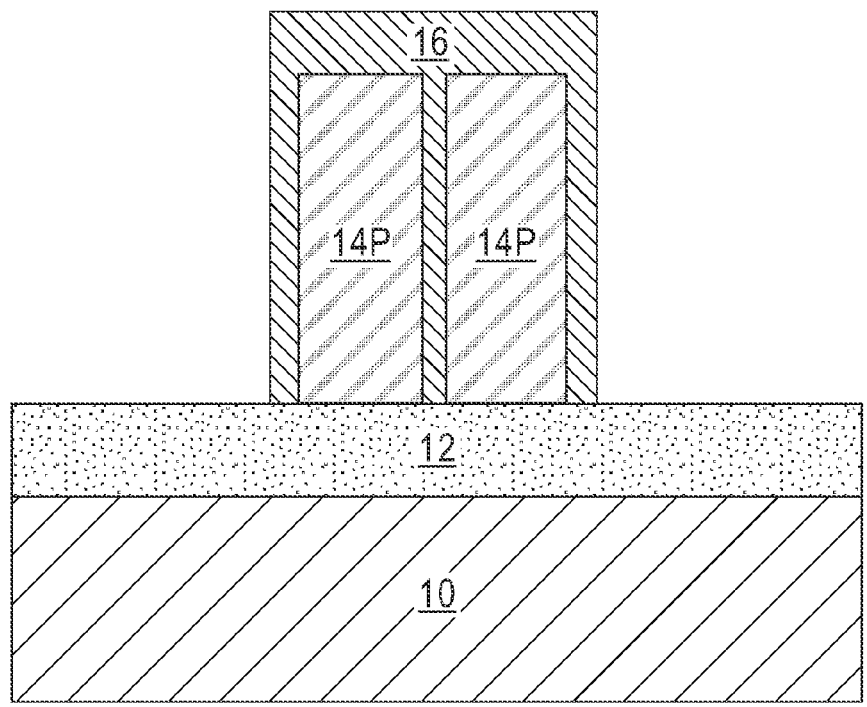
FIG. 3 is a cross sectional view of the exemplary semiconductor structure of FIG. 2 after forming an oxide material surrounding each silicon germanium alloy portion.

Referring now to FIG. 3, there is illustrated the exemplary semiconductor structure of FIG. 2 after forming an oxide material 16 surrounding each silicon germanium alloy portion 14P. As is shown, the oxide material 16 is formed along the sidewall surfaces and atop each silicon germanium alloy portion 14P. As is further shown, the oxide material 16 has a topmost surface that is located above a topmost surface of each silicon germanium alloy portion 14P. As is also shown, a portion of the oxide material 16 completely fills any gap between neighboring silicon germanium alloy portions 14P.

In one embodiment of the present application, the oxide material 16 is composed of silicon dioxide. Other dielectric oxides can also be used in the present application as oxide material 16 so long as the selected dielectric oxide can be used as a germanium diffusion cap during a subsequently performed thermal condensation process. The oxide material 16 can be formed utilizing a deposition process such as, for example, chemical vapor deposition or plasma enhanced chemical vapor deposition. In one embodiment of the present application, the thickness of the oxide material 16 can be from 20 nm to 200 nm. Other thicknesses that are greater than, or lesser than, the aforementioned thickness range can also be used as the thickness of oxide material 16 as long as the oxide material has a height that is greater than the height of each silicon germanium alloy portion 14P.

Figure 4:
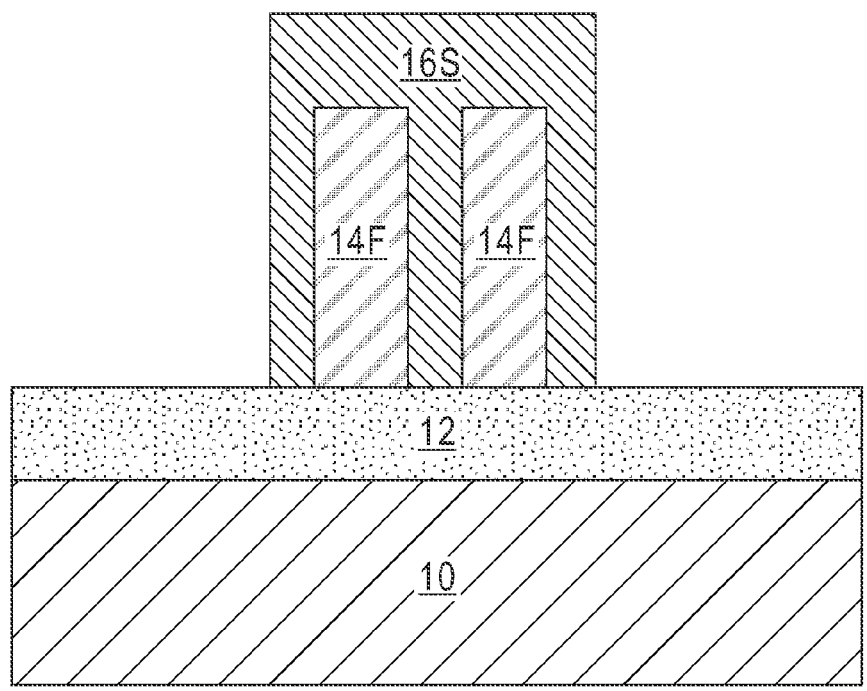
FIG. 4 is a cross sectional view of the exemplary semiconductor structure of FIG. 3 after performing a thermal condensation process which coverts each silicon germanium alloy portion of the first germanium content into a silicon germanium alloy fin having a second germanium content that is greater than the first germanium content.

Referring now to FIG. 4, there is illustrated the exemplary semiconductor structure of FIG. 3 after performing a thermal condensation process which coverts each silicon germanium alloy portion 14P of the first germanium content into a silicon germanium alloy fin 14F having a second germanium content that is greater than the first germanium content.

During the condensation process, oxide material 16 is converted into oxide structure 16S. Oxide structure 16S includes oxide material 16 plus a surface oxide composed of silicon dioxide that forms around each silicon germanium alloy fin 14F. The surface oxide is formed along sidewall surfaces and a topmost surface of each silicon germanium alloy fin 14F. In some embodiments, the surface oxide and the dielectric material 16 both comprise silicon dioxide. In other embodiments, the dielectric material 16 comprises a dielectric oxide other than silicon dioxide. For clarity, the surface oxide is not specifically shown in the drawings of the present application.

The thermal condensation process can also be referred to here as an oxidation process. During the thermal condensation process, Si atoms in each silicon germanium alloy portion 14P react with oxygen forming the surface oxide layer (not shown) and Ge atoms from each silicon germanium alloy portion 14P diffuse inward to form a silicon germanium alloy fin 14F having the second germanium content that is greater than the first germanium content; the insulator layer 12 and the oxide material 16 serve as Ge diffusion caps. The thermal condensation process can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constitutes from 2 volume % to 95 volume % of an oxidizing ambient containing admixture. The thermal condensation process can be performed at a temperature from 600° C. to 1200° C. The thermal condensation process may include a furnace anneal, a rapid thermal anneal or any other anneal that can convert each silicon germanium alloy portion 14P into a silicon germanium alloy fin 14F.

Each silicon germanium alloy fin 14F that is formed has a second height (i.e., thickness) that is less than the first height (i.e., thickness) of each silicon germanium alloy portion 14P. In one embodiment, the second height of each silicon germanium alloy fin 14F is from 30 nm to 150 nm. Also, each silicon germanium alloy fin 14F that is formed has a second width that less than the width of each silicon germanium alloy portion 14P. In one embodiment, the second width of each silicon germanium alloy fin 14F is from 10 nm to 150 nm.

As mentioned above, the second germanium content of each silicon germanium alloy fin 14F is greater than the first germanium content of the silicon germanium alloy portions 14P. In one embodiment, the second germanium content of each silicon germanium alloy fin 14F is from 20 atomic percent to 50 atomic percent.

Each silicon germanium alloy fin 14F has a topmost surface that is coplanar with each other. Each silicon germanium alloy fin 14F has a bottommost surface that directly contacts a portion of the underlying insulator layer 12.

Figure 5:
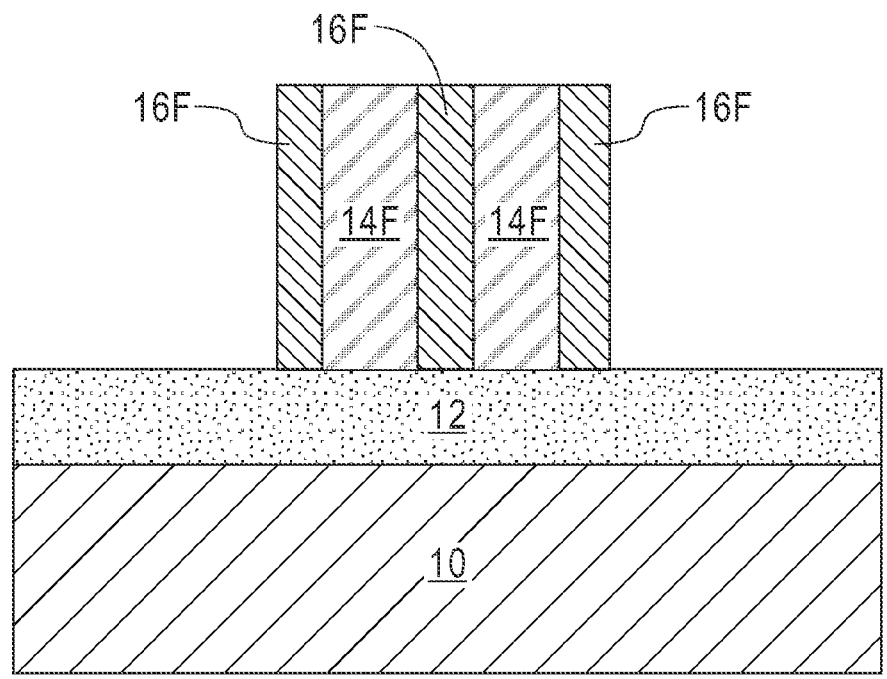
FIG. 5 is a cross sectional view of the exemplary semiconductor structure of FIG. 4 after performing a planarization process to expose a topmost surface of each silicon germanium alloy fin and to form oxide fins located on sidewall surfaces of each silicon germanium alloy fin.

Referring now to FIG. 5, there is illustrated the exemplary semiconductor structure of FIG. 4 after performing a planarization process which provides oxide fins 16F located on sidewall surfaces of each silicon germanium alloy fin 14F. The planarization process removes a portion of the oxide structure 16S that is located above a topmost surface of each silicon germanium alloy fin 14F and thus exposes the topmost surface of each silicon germanium alloy fin 14F. The planarization process that can be employed in the present application may include chemical mechanical polishing (CMP). The oxide fins 16F comprise a remaining portion of the oxide material and the surface oxide. In one embodiment, each oxide fin 16F is composed of silicon dioxide.

Each oxide fin 16F has a width that is less than a width of each silicon germanium alloy fin 14F. In one embodiment, each oxide fin 16F has a width from 2 nm to 5 nm. Each oxide fin 16F has a topmost surface that is coplanar with a topmost surface of each silicon germanium alloy fin 14F. Each oxide fin 16F has a bottommost surface that contacts a portion of the underlying insulator layer 12. As is shown, each oxide fin 16F is located on a sidewall surface of each silicon germanium alloy fin 14F, and an oxide fin (center one shown in FIG. 5) directly contacts a sidewall surface of two different silicon germanium alloy fins 14F.

Figure 6:
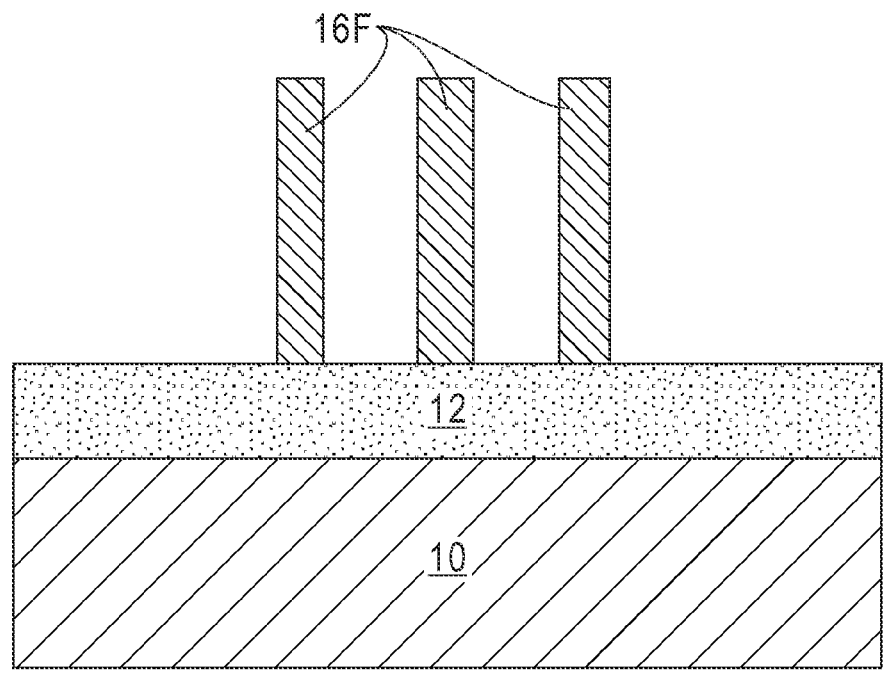
FIG. 6 is a cross sectional view of the exemplary semiconductor structure of FIG. 5 after removing each silicon germanium alloy fin.

Referring now to FIG. 6, there is illustrated the exemplary semiconductor structure of FIG. 5 after removing each silicon germanium alloy fin 14F. Each silicon germanium alloy fin 14F can be removed utilizing an etching process that selectively removes silicon germanium. In one embodiment of the present application, the etching process utilizes a chemical wet etchant such as, for example, hydrofluoric acid (HF). It is noted that the etching process used to remove each silicon germanium alloy fin 14F is not a reactive ion etch and thus no reactive ion etch damage occurs to the sidewall surfaces of each remaining oxide fin 16F. Each oxide fin 16F extends vertically upwards from the insulator layer 12.

Figure 7:
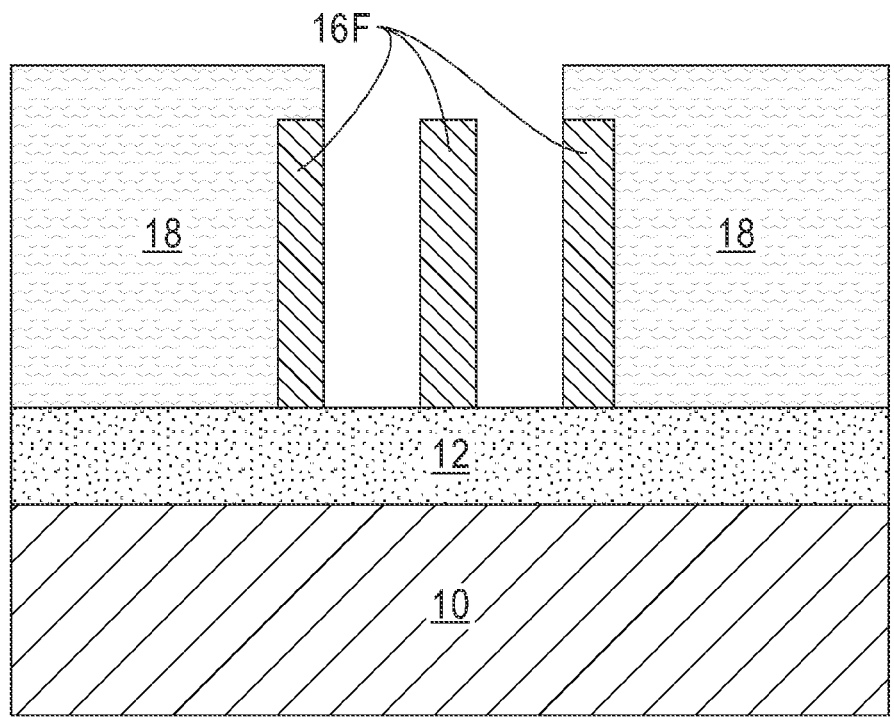
FIG. 7 is a cross sectional view of the exemplary semiconductor structure of FIG. 6 after forming a capacitor metal block mask.

Referring now to FIG. 7, there is illustrated the exemplary semiconductor structure of FIG. 6 after forming a capacitor metal block mask 18. The capacitor metal block mask 18 may comprise any block mask material having a different etch selectivity than oxide fins 16F such as, for example, silicon nitride. The capacitor metal block mask 18 can be formed by deposition of a block mask material, followed by patterning the deposited block mask material utilizing lithography and etching as defined above.

The capacitor metal block mask 18 has an opening that exposes one of the oxide fins 16F; in the illustrated embodiment, the opening within the capacitor metal block mask 18 exposes one of the oxide fins 14F that is located between the oxide fin 16F on the left hand side of the drawing, and the oxide fin 16F on the right hand side of the oxide 16F.

Figure 8:
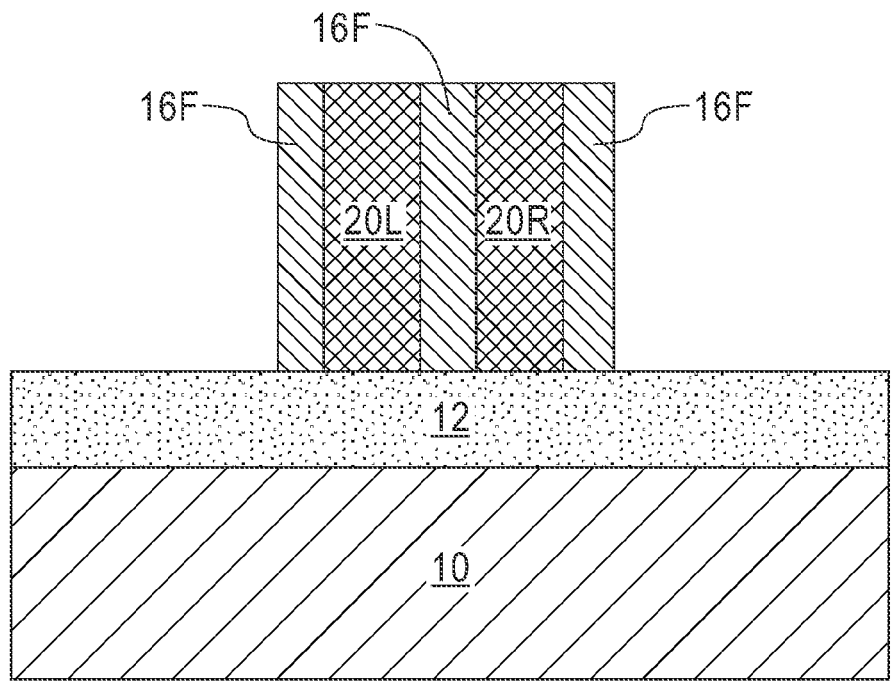
FIG. 8 is a cross sectional view of the exemplary semiconductor structure of FIG. 7 after forming a first metal structure between a first set of oxide fins, and a second metal structure between a second set of oxide fins and removing the capacitor metal block mask.

Referring now to FIG. 8, there is illustrated the exemplary semiconductor structure of FIG. 7 after forming a first metal structure 20L between a first set of oxide fins (e.g., far left and middle oxide fin), and a second metal structure 20R between a second set of oxide fins (middle oxide fin and far right oxide fin) and removing the capacitor metal block mask 18.

The first metal structure 20L forms a first vertical plate of the inventive MIM capacitor, while the second metal structure 20R forms a second vertical plate of the inventive MIM capacitor. The oxide fin 16 that is located directly between the first and second metal structures 20L, 20R provides a vertical insulator of the inventive MIM capacitor. The first and second metal structures 20L, 20R can be formed by first depositing a layer of a conductive metal or conductive metal nitride. Exemplary materials that may be used for the first and second metal structures 20L, 20R may include titanium (Ti), titanium nitride (TiN), tantalum (Ta), tantalum nitride (TaN), or copper (Cu). The layer of conductive metal or conductive metal nitride can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. The layer of conductive metal or conductive metal nitride fills the gaps located between each oxide fin 16F that is exposed within the opening of the capacitor metal block mask 18. The layer of conductive metal or conductive metal nitride typically extends to at least the topmost surface of each oxide fin 16F; typically the layer of conductive metal or conductive metal nitride extends above the exposed oxide fin 16F not completely covered by the capacitor metal block mask 18. Next, the capacitor metal block mask 18 can be removed utilizing any block mask removal process including, for example, an etch back process. Following the removal of the capacitor metal block mask 18, a planarization process such as, for example, chemical mechanical planarization can be used to provide the first and second metal structures 20L, 20R.

Notably, FIG. 8 illustrates an exemplary semiconductor structure of the present application. Specifically, a vertically orientated metal-insulator-metal (MIM) capacitor (20L, 16F, 20R) is provided on a surface of an insulator layer 12 that is located on a handle substrate 10. The MIM capacitor includes a first metal structure 20L extending upwards from a first portion of the insulator layer 12, a second metal structure 20R extending upwards from a second portion of the insulator layer 12, and an oxide fin (i.e., middle oxide fin 16F) located between the first and second metal structures (20L, 20R), wherein the oxide fin 16F directly contacts an entirety of a sidewall surface of the first metal structure 20L and an entirety of a sidewall surface of the second metal structure 20R, the oxide fin 16F having a topmost surface that is coplanar with a topmost surface of both the first and second metal structures (20L, 20R). In accordance with the present application, a vertical interface between the first metal structure 20L and the oxide fin (i.e., middle oxide fin 16F), and a vertical interface between the second metal structure 20R and the oxide fin (i.e., the middle oxide fin) are both free of reactive-ion etch damages. No portion of any of the oxide fin directly contacts a topmost surface of the first and second metal structures 20L, 20R.

In accordance with an embodiment of the present application, each oxide fin 16F has a bottommost surface that is coplanar with a bottommost surface of the first and second metal structures 20L, 20R. Also, each oxide fin 16F has a topmost surface that is coplanar with a topmost surface of the first and second metal structures 20L, 20R. Further, each oxide fin 16F has a width that is less than a width of the first and second metal structure 20L, 20R. The metal structures 20L, 20R comprise a same conductive metal or metal nitride. In accordance with the present application, the width of the first metal structure 20L is the same as the width of the second metal structure 20R, and the width of each metal structure is determined by the width of the silicon germanium alloy fins.

Figure 9:
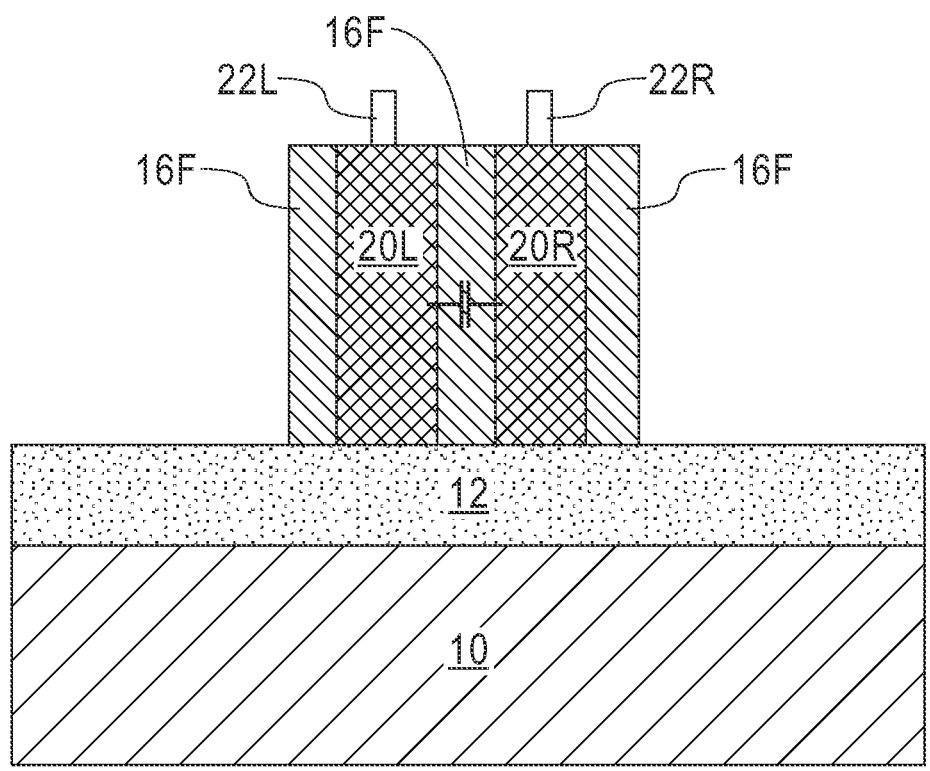
FIG. 9 is a cross sectional view of the exemplary semiconductor structure of FIG. 8 after forming a first contact structure to the first metal structure and a second contact structure to the second metal structure.

Referring now to FIG. 9, there is illustrated the exemplary semiconductor structure of FIG. 8 after forming a first contact structure 22L to the first metal structure 20L and a second contact structure 22R to the second metal structure 20R. The first contact structure 22L, and the second contact structure 22R can be formed by deposition of a contact metal such as, for example, Al, Cu or a Cu—Al alloy, and then patterning the same by lithography and etching. Typically, the conductive metal includes a different material than that which provides the first and second metal structures 20L, 20R.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    forming an oxide material surrounding a plurality of silicon germanium alloy portions having a first germanium content, each of said silicon germanium alloy portions extending upwards from a surface of an insulator layer;
    performing a thermal condensation process to convert each silicon germanium alloy portion into a silicon germanium alloy fin having a second germanium content that is greater than said first germanium content;
    performing a planarization process to expose a topmost surface of each silicon germanium alloy fin and to form oxide fins located on each sidewall surface of each silicon germanium alloy fin, wherein at least one of said oxide fins directly contacts a sidewall surface of one of said silicon germanium alloy fins and a sidewall surface of another of said silicon germanium alloy fins; and
    replacing each silicon germanium alloy fin with a metal structure to provide a vertically orientated metal-insulator-metal (MIM) capacitor structure.

2. The method of claim 1, wherein each oxide fin has a topmost surface that is coplanar with a topmost surface each metal structure.

3. The method of claim 2, wherein a bottommost surface of each oxide fin is coplanar with a bottommost surface of each metal structure.

4. The method of claim 1, wherein said plurality of silicon germanium alloy portions having said first germanium content are formed by providing a silicon germanium-on-insulator substrate comprising, from bottom to top, a handle substrate, said insulator layer, and a silicon germanium alloy layer having said first germanium content, and patterning said silicon germanium alloy layer.

5. The method of claim 1, wherein each silicon germanium alloy portion has a first height and a first width, and wherein each silicon germanium alloy fin has a second height and a second width, wherein said second height is less than said first height, and said second width is less than said first width.

6. The method of claim 1, wherein said performing said thermal condensation process comprises an oxidation that is performed at a temperature from 600° C. to 1200° C.

7. The method of claim 1, wherein said replacing each silicon germanium alloy fin with said metal structure comprises:
    removing each silicon germanium alloy fin utilizing an etch that is selective in removing silicon germanium;
    forming a capacitor metal block mask having an opening that completely exposes an area that includes one of said oxide fins;
    depositing a conductive metal or metal nitride within said area and surrounding said one of said oxide fins;
    removing said capacitor metal block mask; and
    planarizing said conductive metal or metal nitride to provide said metal structure.

8. The method of claim 1, further comprising forming a contact structure on a portion of a topmost surface of each metal structure.

9. The method of claim 1, wherein a vertical interface between each metal structure and each oxide fin is free of reactive-ion etch damages.

10. The method of claim 1, wherein each oxide fin has a width that is less than a width of each metal structure.

\* \* \* \* \*